United States Patent
Ko

(10) Patent No.: US 7,321,634 B2
(45) Date of Patent: Jan. 22, 2008

(54) METHOD AND APPARATUS FOR VARIABLE SIGMA-DELTA MODULATION

(75) Inventor: Herbert L. Ko, Mountain View, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 236 days.

(21) Appl. No.: 11/015,608

(22) Filed: Dec. 17, 2004

(65) Prior Publication Data

US 2006/0133517 A1    Jun. 22, 2006

(51) Int. Cl.
*H04L 27/00* (2006.01)

(52) U.S. Cl. ...................................... 375/295

(58) Field of Classification Search ................ 375/295, 375/297, 296, 146
See application file for complete search history.

(56) References Cited

U.S. PATENT DOCUMENTS

| | | | | |
|---|---|---|---|---|
| 4,941,154 A | * | 7/1990 | Wei | 375/265 |
| 5,424,739 A | * | 6/1995 | Norsworthy et al. | 341/143 |
| 5,621,761 A | * | 4/1997 | Heegard | 375/265 |
| 6,075,474 A | * | 6/2000 | Gabet et al. | 341/143 |
| 6,469,648 B2 | * | 10/2002 | Nakao et al. | 341/153 |
| 6,717,998 B2 | * | 4/2004 | Adachi et al. | 375/376 |
| 2003/0174799 A1 | * | 9/2003 | Fahim | 375/376 |
| 2003/0219091 A1 | * | 11/2003 | Riley | 377/47 |
| 2004/0052310 A1 | * | 3/2004 | Noguchi et al. | 375/243 |
| 2004/0081266 A1 | * | 4/2004 | Adachi et al. | 375/376 |
| 2004/0101080 A1 | * | 5/2004 | Lee | 375/375 |
| 2005/0148307 A1 | * | 7/2005 | Zipper | 455/102 |

* cited by examiner

*Primary Examiner*—Chieh M. Fan
*Assistant Examiner*—Jason M. Perilla

(57) ABSTRACT

A method and apparatus for modulating a digital input signal is disclosed. The digital input signal is partitioned into a less-significant bit signal and a more-significant bit signal. A lower-order modulation of the less-significant bit signal is performed to generate an intermediate output signal. The intermediate output signal is appended to the more-significant bit signal to form an intermediate input signal. A higher-order modulation of the intermediate input signal is performed to generate a digital output signal. The higher-order modulation is of an order higher than the lower-order modulation. A phase-locked loop using the method and apparatus is disclosed.

11 Claims, 3 Drawing Sheets

METHOD AND APPARATUS FOR VARIABLE SIGMA-DELTA MODULATION

BACKGROUND ART

The present invention relates generally to a method and apparatus for implementation of digital modulation circuits, and specifically, to a method and apparatus for variably modulating a digital input signal in such circuits.

The dramatic increase in the capabilities and use of digital electronic products such as computers, radios, compact disk players, and cell phones has resulted in increased need for inexpensive digital electronic circuits that operate at higher and higher speeds. One such circuit is a sigma-delta modulator.

Sigma-delta modulators are use in a wide variety of electronic products. One such use is in a digital-to-analog converter in a compact disk player. The digital sigma-delta modulator is used to convert 2×16-bit words read from the compact disk at 44.1 kHz into 2×1-bit words at 16 times the original rate. The 1-bit words are converted into an analog signal using a 1-bit digital-to-analog converter, which is much easier to fabricate and make accurate than a 16-bit digital-to-analog converter.

Another use of sigma-delta modulators is in frequency synthesizers. Frequency synthesizers are digital electronic circuits that generate signals having different frequencies than the frequency of the input signal. In this application, sigma-delta modulators are used to provide a temporally-varying divide ratio sequence to control the division ratio of a frequency divider in the phase-locked loop. The division ratio determines the frequency ratio between the output signal and the input signal of the phase-locked loop.

Although sigma-delta modulators have proven useful in applications such as those exemplified above, they have some drawbacks. Attempts have been made to use higher-order sigma-delta modulators to attain better noise shaping characteristics. The size and power consumption of higher-order sigma-delta modulators, however, increase dramatically as the order and resolution increases. The increase in circuit size and power consumption is the result of the need for more and larger multipliers in higher-order sigma-delta modulators. Consequently, higher-order sigma-delta modulators are typically complex and expensive to manufacture.

Although attempts have been made to deal with the problems associated with the use of higher-order sigma-delta modulators, existing solutions are complex and expensive to implement due to the complexity of the circuitry required. Solutions to these problems have long been sought but prior developments have not taught or suggested any solutions and, thus, solutions to these problems have long eluded those skilled in the art.

DISCLOSURE OF THE INVENTION

The present invention provides a method and apparatus for modulating a digital input signal. The digital input signal is partitioned into a less-significant bit signal and more-significant bit signal. A lower-order modulation of the less-significant bit signal is performed to generate an intermediate output signal. The intermediate output signal is appended to the more-significant bit signal to form an intermediate input signal. A higher-order modulation of the intermediate input signal is performed to generate a digital output signal. The higher-order modulation is of an order higher than the lower-order modulation. As an example, a phase-locked loop using the method and apparatus is provided.

Certain embodiments of the invention have other aspects in addition to or in place of those mentioned above. The other aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Figure 1:
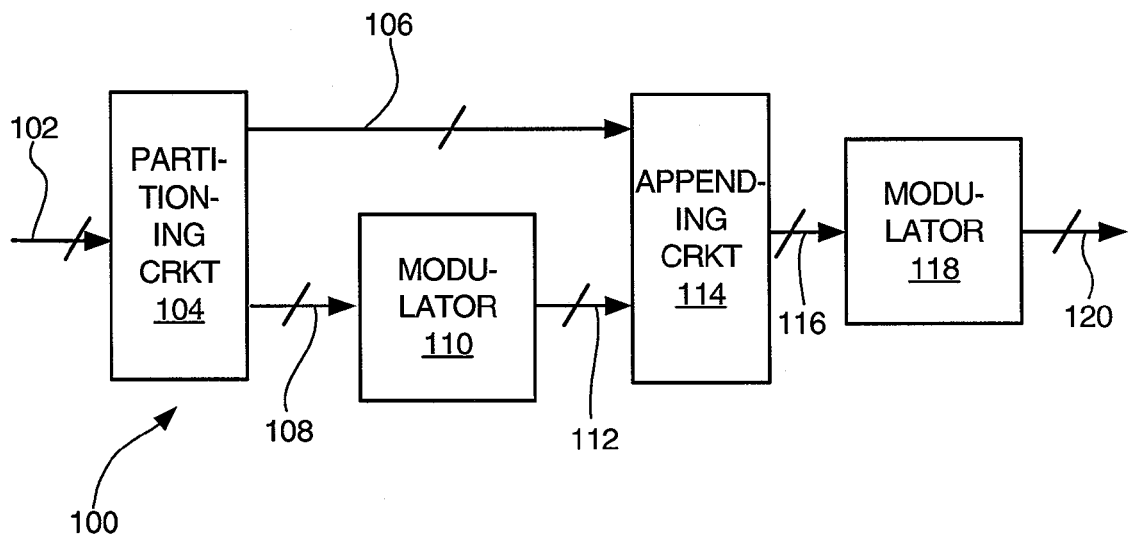
FIG. 1 is a block diagram of a sigma-delta modulator in accordance with an embodiment of the present invention.

Referring now to FIG. 1, therein is shown a block diagram of sigma-delta modulator 100 in accordance with an embodiment of the present invention. The sigma-delta modulator 100 receives an (M+L)-bit digital input signal 102. The digital input signal is delivered to a partitioning circuit 104. The partitioning circuit 104 partitions the digital input signal into an M-bit more-significant bit signal (MSB signal) 106 and an L-bit less-significant bit signal (LSB signal) 108.

The L-bit LSB signal 108 is received by a lower-order sigma-delta modulator 110. In response to the L-bit LSB signal 108, the lower-order sigma-delta modulator 110 generates a P-bit intermediate output signal 112. Typically, the lower order sigma-delta modulator 110 is a first order modulator since first order modulators need no multipliers, and P is equal to 1.

The P-bit intermediate output signal 112 is input to an appending circuit 114. The M-bit MSB signal 106 also is input to the appending circuit 114. The appending circuit 114 appends the P-bit words of the intermediate output signal 112 to the M-bit words of the MSB signal 106 to generate an (M+P)-bit intermediate input signal 116. The P-bit words of the intermediate output signal 112 constitute the P less-significant bits of the (M+P)-bit words of the intermediate input signal 116.

The (M+P)-bit intermediate input signal 116 is input to a higher-order sigma-delta modulator 118 of an order higher than the lower-order sigma-delta modulator 110. In an example, the lower-order sigma-delta modulator 110 is a first order sigma-delta modulator and the higher-order sigma-delta modulator 114 is a second- or higher-order sigma-delta modulator, such as a third-order sigma-delta modulator.

In response to the (M+P)-bit intermediate input signal 116, the higher-order sigma-delta modulator 118 generates an R-bit digital output signal 120 that represents the digital input signal 102. Typically, the words of the digital output signal 120 are composed of three or fewer bits, but the word rate of the digital output signal 120 is substantially higher than that of the digital input signal 102. In an example in which the digital input signal 102 is composed of 30-bit words and the digital output signal 120 is composed of 3-bit words, the word rate of the digital output signal 120 is typically 30 times the word rate of the digital input signal 102. The structure and operation of the lower-order modulator 110 and the higher-order modulator 118 are described in more detail below with reference to FIG. 2.

Figure 2:
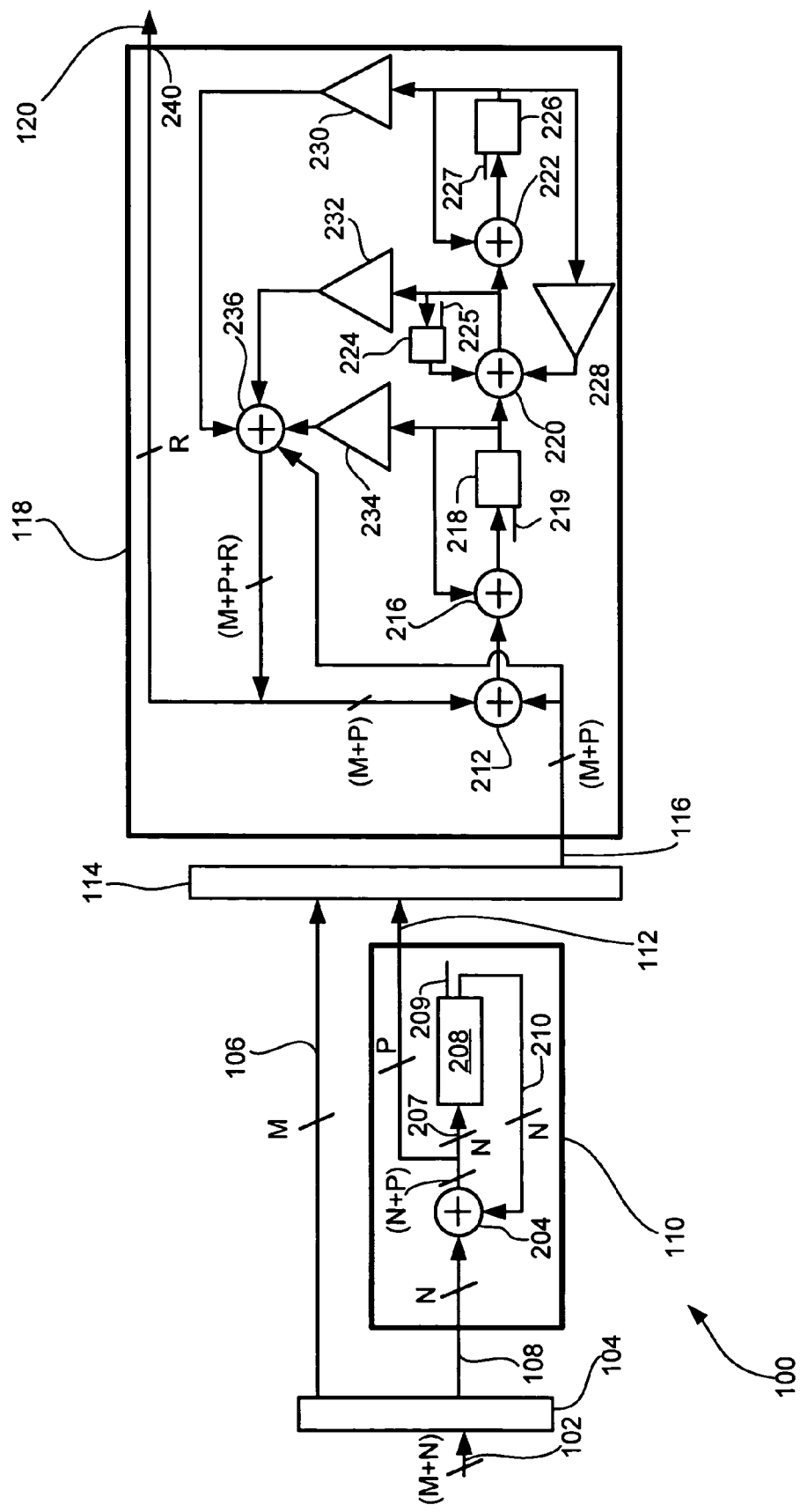
FIG. 2 is a more detailed block diagram of the sigma-delta modulator shown in FIG. 1.

Referring now to FIG. 2, therein is shown a more detailed block diagram of an exemplary embodiment the sigma-delta modulator 100 shown in FIG. 1 in which the lower-order sigma-delta modulator 110 is a first-order sigma-delta modulator and the higher-order sigma-delta modulator 118 is a third-order sigma-delta modulator. The digital input signal 102 is connected to the input of the partitioning circuit 104. The digital input signal 102 is a signal composed of (M+L)-bit words. The partitioning circuit 104 partitions each (M+L)-bit word of the digital input signal 102 by taking the M more-significant bits of the digital input signal word as a word of the MSB signal 106 and the L less-significant bits of the digital input signal word as a word of the LSB signal 108. In an embodiment, the partitioning circuit 104 receives the digital input signal 102 via an (M+L)-line bus and partitions the digital input signal 120 by splitting the (M+L)-line into an M-line bus that carries the MSB signal 106 and an L-line bus that carries the LSB signal 108.

The output of the partitioning circuit 104 that provides the MSB signal 106 is connected to a first input of the appending circuit 114.

The output of the partitioning circuit 104 that provides the LSB signal 108 is connected to the input of the lower-order sigma-delta modulator 110 (a first-order modulator in this example). The lower-order modulator 110 is composed of an L-bit first adder 204 and a first delay register 208. One input of the first adder 204 is connected to receive the LSB signal 108 from the partitioning circuit 104. The most-significant bit output of the first adder 204 is connected to a second input of the appending circuit 114 to provide the P-bit intermediate output signal 116 thereto. In this example, P is equal to 1, but in general, it can be 2 or more. The remainder is returned to the first delay register 208 for use in the next computation cycle. The first delay register 208 also receives a clock signal at a clock input 209. The output of the first delay register 208 is connected to the other input of the first adder 204 to provide a delayed sum signal 210 thereto.

In an embodiment, the LSB signal 108 and the delayed sum signal 210 are conveyed to the inputs of the L-bit first adder 204 by respective busses that are L lines wide and the output of L-bit first adder 204 is connected to a bus that is (L+1) lines wide. Of the (L+1) lines, L lines are connected to the input of the first delay register 208 and the most-significant bit output of the L-bit first adder 204 is connected to the second input of the appending circuit 114 to provide the intermediate output signal 112 thereto.

The appending circuit 114 appends the 1-bit intermediate output signal 112 to the M-bit MSB signal 106 to provide the (M+1)-bit intermediate input signal 116. Each 1-bit word of the intermediate output signal 112 constitutes the least-significant bit of the respective (M+1)-bit word of the intermediate input signal 116. In an embodiment, the appending circuit 114 comprises a data register (not shown) that receives the M-bit MSB signal 106 at its more-significant bit inputs and receives the 1-bit intermediate output signal 112 from the lower-order modulator 110 at its least-significant bit input. The data register provides the (M+1)-bit intermediate input signal 116 as the output of the appending circuit 114. The data register typically controls the timing of the MSB signal 106 and the intermediate output signal 112 so that each (M+1)-bit word of the intermediate input signal 116 is composed of an M-bit word of the MSB signal 106 and a 1-bit word of the intermediate output signal 112 that is derived from an L-bit word of the LSB signal 108 that, together with the M-bit word of the MSB signal 106, originally constituted one (M+L)-bit word of the digital input signal 102. In another embodiment, the appending circuit receives the MSB signal 106 via an M-line bus and receives the intermediate output signal 112 via a 1-line bus and simply merges these busses to form an (M+1)-line bus that carries the intermediate input signal 116.

The output of the appending circuit 114 is connected to the higher-order modulator 118. The higher-order modulator 118 is composed of second, third, fourth, fifth and sixth adders 212, 216, 220, 222 and 236, respectively; second, third and fourth delay registers 218, 224 and 226, respectively; and first, second, third and fourth multipliers 228, 230, 232 and 234, respectively.

In the higher-order modulator 118 (a third-order modulator in this example), one input of the second adder 212 is connected to receive the (M+1)-bit intermediate input signal 116 output by the appending circuit 114. The output of the second adder 212 is connected to one input of the third adder 216. The output of the third adder 216 is connected to the input of the second delay register 218. The second delay register 218 also receives the clock signal at a clock input 219. The output of the second delay register 218 is connected to the first input of the fourth adder 220 and is fed back to the other input of the third adder 216.

The output of the fourth adder 220 is connected to one input of a fifth adder 222 and is additionally fed back to a second input of the fourth adder 220 through the third delay register 224. The third delay register 224 receives the clock signal at a clock input 225. The output of the fifth adder 222 is connected to the input of the fourth delay register 226. The fourth delay register 226 receives the clock signal at a clock input 227. The output of the fourth delay register is fed back to the other input of the fifth adder 222 and is additionally connected to a third input of the fourth adder 220 through the first multiplier 228.

The first, second, third and fourth multipliers 228, 230, 232 and 234, respectively, are each configured as an amplifier to multiply their respective inputs by filter coefficients that are programmed inside the multipliers. The filter coefficients determine the noise shaping characteristics of the third order sigma-delta modulator 118.

The output of the fourth delay register 226 also is connected to the input of the second multiplier 230. The output of the fourth adder 220 also is connected to the input of the third multiplier 232. The output of the second delay register 218 also is connected to the input of the fourth multiplier 234. The outputs of the second multiplier 230, the third multiplier 232, and the fourth multiplier 234 are connected to respective inputs of the sixth adder 236. The intermediate input signal 116 also is connected to an additional input of the sixth adder 236.

The output of the sixth adder 236 is an (M+1+R)-bit output. The R more-significant bit outputs of the sixth adder 236 are connected to the output 240 of the higher-order modulator 118 to provide the R-bit digital output signal 120 representative of the digital input signal 102. The remaining (M+1) less-significant bit outputs of the sixth adder 236 are connected to the other input of the second adder 212 to provide a feedback signal thereto. The digital output signal 120 of the higher-order modulator 118 has an output sequence whose average is the value of the digital input signal 102. The digital output signal 120 of the higher-order modulator 118 may be used, for example, to control the division ratio of a divider in a PLL, as will be described below with reference to FIG. 4.

It has thus been discovered that high resolution can be obtained in a sigma-delta modulator by partitioning an (M+L)-bit digital input signal into an L-bit LSB signal and an M-bit MSB signal. The LSB signal is subject to sigma-delta modulation by the lower-order modulator to generate an intermediate output signal. The lower-order modulator can be implemented, in general, with fewer, simpler multipliers than the higher-order modulator, and, in the specific example of a first-order modulator, with no multipliers. The intermediate output signal generated by the lower-order modulator is then appended to the MSB signal to form an intermediate input signal that is subject to sigma-delta modulation by the higher-order modulator to generate a digital output representative of the digital input signal. The intermediate output signal provides the less-significant bits of the intermediate input signal.

Partitioning the digital input signal into the LSB signal that is subject to sigma-delta modulation by the lower-order modulator reduces the size of the multipliers needed in the higher-order modulator to subject the intermediate input signal to sigma-delta modulation since the number of gates in the multipliers is proportional to the square of the number of bits. The result is a smaller circuit that consumes less power while maintaining an acceptable resolution and noise level. The digital input signal can be partitioned into an LSB signal and an MSB signal of any number of LSBs and MSBs as needed depending upon the requirements of a particular design taking into account the resolution and noise level required, the space available for the circuit, and the power consumption constraints. In general, the lower the noise level required, the greater the number of MSBs required.

In an exemplary embodiment, the digital input signal 102 is a 30-bit signal and is partitioned by the partitioning circuit 104 into a 21-bit LSB signal 108 and a 9-bit MSB signal 106. The lower-order modulator 110 is a first-order modulator; therefore, the lower-order modulator 110 has an absence of multipliers. The intermediate output signal 112 generated by the lower-order modulator 110 is a single-bit signal that represents the LSB signal 108. The appending circuit 114 appends the single-bit intermediate output signal 112 to the MSB signal received 106 to form a 10-bit intermediate input signal 116. A third order modulator 118 subjects the intermediate input signal to sigma-delta modulation to generate a 3-bit digital output signal 120. The three-bit digital output signal 120 is representative of the 30-bit digital input signal 102. In this example, the variables M, N, P, and R discussed above are as follows: M=9, N=21, ((M+N)=30), P=1 and R=3. In other examples, P is more than unity and R is more or less than three.

A conventional third-order sigma-delta modulator would use 33-bit multipliers to process the 30-bit digital input signal with 3 extra bits for the output in the example just described. In contrast, the sigma-delta modulator 100 in accordance with the invention partitions the 30-bit digital input signal 102 into a 9-bit MSB signal 106 and a 21-bit LSB signal 108. An embodiment of the first order modulator 110 that has no multipliers is used to subject the LSB signal 108 to sigma-delta modulation. An embodiment of the third order modulator 118 in which the multipliers are 13-bit multipliers is used to subject the intermediate input signal 116 to sigma-delta modulation. The sigma-delta modulator 100 in accordance with the invention therefore uses 13-bit multipliers instead of 33-bit multipliers. The die area of an integrated circuit embodiment of the sigma-delta modulator 100 and the power consumption of the circuit are controlled by the size of multipliers whose gate count is proportional to the square of the number of bits. Accordingly, embodiments of the sigma-delta modulator 100 in accordance with the invention have only approximately one eighth of the number of gates of a conventional third-order modulator sigma-delta modulator having 33-bit multipliers.

Figure 3:
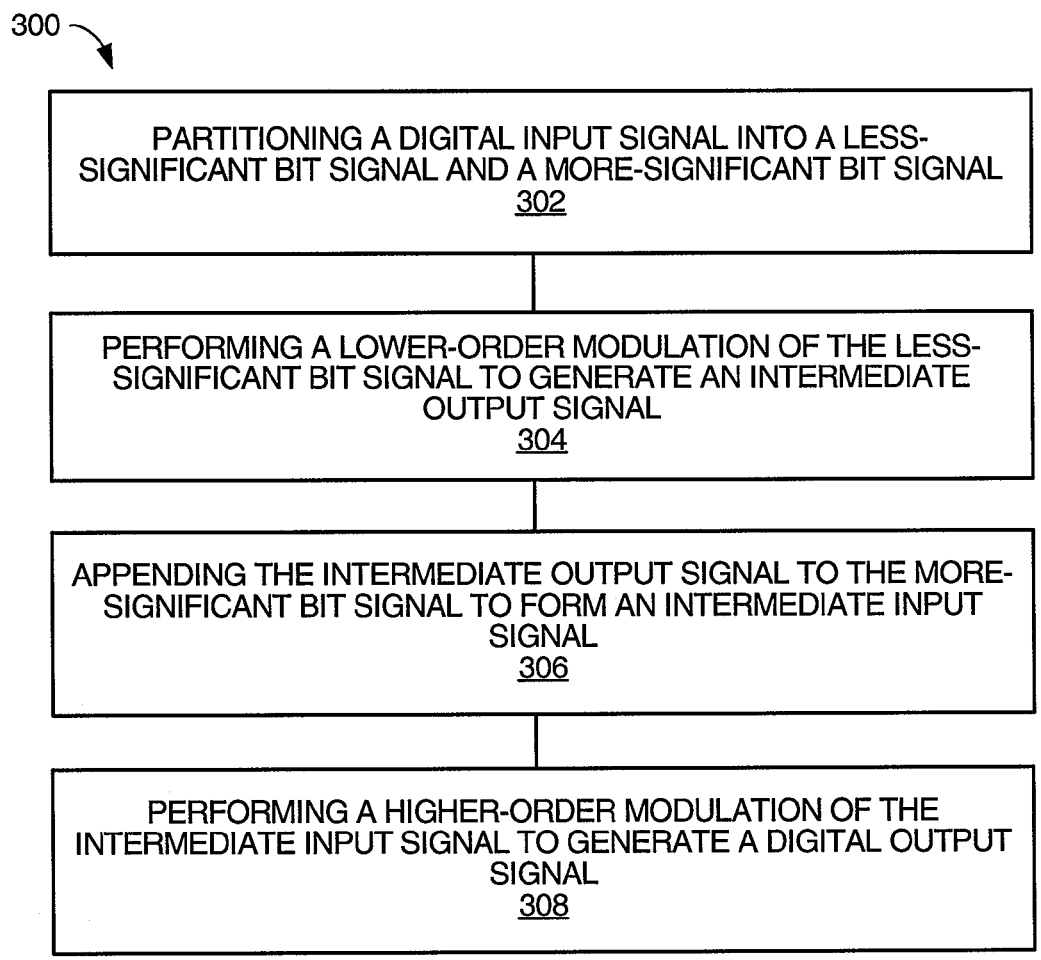
FIG. 3 is a flow chart of the method for modulating a digital input signal in accordance with an embodiment of the present invention.

Referring now to FIG. 3, therein is shown a flow chart of a method 300 for modulating a digital input signal in accordance with an embodiment of the present invention. The method 300 includes partitioning a digital input signal into a less-significant bit signal and a more-significant bit signal in a block 302; performing a lower-order modulation of the less-significant bit signal to generate an intermediate output signal in a block 304; appending the intermediate output signal to the more-significant bit signal to form an intermediate input signal in a block 306; and performing a higher-order modulation of the intermediate input signal to generate a digital output signal in a block 308. The higher-order modulation is of an order higher than the lower-order modulation.

Figure 4:
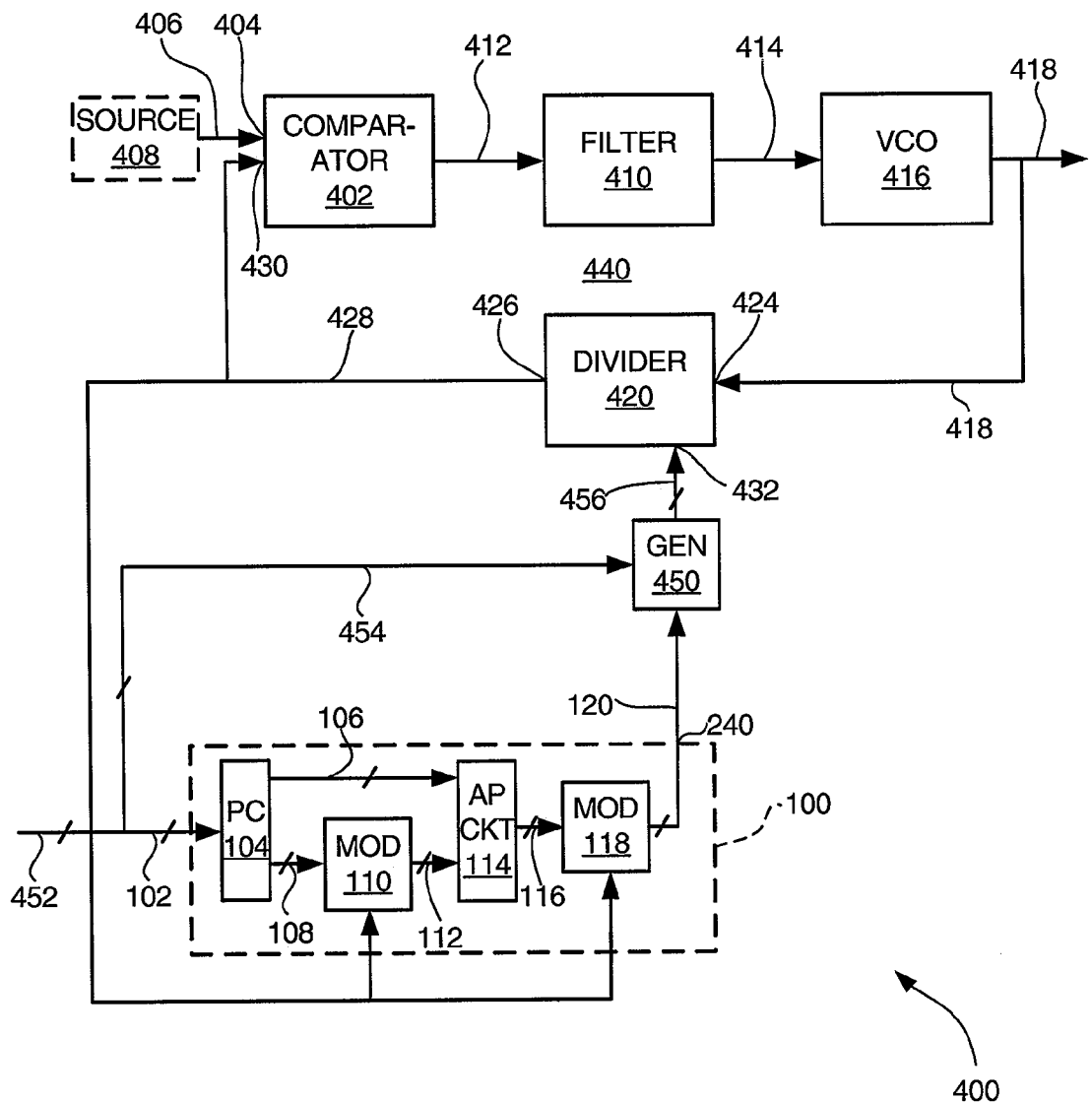
FIG. 4 is a block diagram of an exemplary phase-locked loop frequency synthesizer controlled by an embodiment of the sigma-delta modulator shown in FIGS. 1 and 2.

Referring now to FIG. 4, therein is shown a block diagram of an exemplary phase-locked loop (PLL) frequency synthesizer 400 incorporating an embodiment of the sigma-delta modulator in accordance with the invention. Sigma-delta modulators in accordance with the invention can be used in other applications, such as the above-mentioned sigma-delta modulator-based digital-to-analog converters.

In a conventional PLL frequency synthesizer, the frequency resolution of the output signal is limited to N*(frequency of reference signal), where N is an integer divide ratio. To achieve a much finer frequency resolution, the frequency synthesizer 400 incorporates a Fractional_N PLL (FNPLL) 440. A typical FNPLL incorporates a frequency divider whose divide ratio alternates between N and N+1 with a duty cycle of r, where r is the fraction of the time that the divide ratio is N+1. Such frequency synthesizer generates an output signal with an output frequency of (N+r)* (frequency of reference signal). However, alternating the divide ratio causes large changes in the period of the output of the frequency divider, which introduces undesirable quantization noise and frequency spurs into the output signal of the frequency synthesizer.

Quantization noise and frequency spurs can be reduced by using a sigma-delta modulator to generate a sigma-delta modulated signal from the fractional portion of a divide ratio control signal. The sigma-delta modulated signal is combined with the integer portion of the divide ratio control signal to form a temporally-varying divide ratio sequence that controls the divide ratio of the frequency divider. Using a sigma-delta modulated signal to generate the temporally-varying divide ratio sequence moves most of the quantization noise and frequency spurs out of the frequency range of interest so that the quantization noise and frequency spurs can be filtered from the output signal with an appropriate filter circuit.

In accordance with the invention, the benefit of using a sigma-delta modulator to generate the sigma-delta modulated signal that is used to generate the temporally-varying divide ratio sequence of a PLL frequency synthesizer can be obtained without the complexity of a conventional sigma-delta modulator with low quantization noise and frequency spurs by using an embodiment of the sigma-delta modulator 100 described above with reference to FIGS. 1 and 2 to generate the sigma-delta modulated signal.

The frequency synthesizer 400 is composed of a reference signal source 408, a Fractional_N phase-locked loop (FNPLL) 440, a divide ratio sequence generator 450, and an embodiment of a sigma-delta modulator 100 in accordance with the invention. The reference signal source 408 generates a reference signal 406 having a precisely defined frequency. The FNPLL 402 incorporates a voltage-controlled oscillator (VCO) 416 that generates an output signal 418. The FNPLL operates to compare the phase of a feedback signal derived by a frequency divider 420 from the output signal 418 with the reference signal 406, and to adjust the frequency of the VCO 416 until the output signal 418 is "locked" in both frequency and phase to the reference signal 406.

The frequency of the output signal 418 generated by the frequency synthesizer 400 is defined by the reference signal 406 and a divide ratio control signal 452. The divide ratio control signal 452 defines the divide ratio of the frequency divider 420 and has an integer portion 454 that defines the integer portion N of the divide ratio and a fractional portion 102 that defines the fractional portion r of the divide ratio, where N and r are as defined above. The sigma-delta modulator 100 receives the fractional portion 120 of the divide ratio control signal and generates a sigma-delta modulated signal 120 that represents the fractional portion of the divide ratio control signal. The divide ratio sequence generator 450 combines the sigma-delta modulated signal 120 with the integer portion 454 of the divide ratio signal to generate a temporally-varying divide ratio sequence 456 that controls the divide ratio of the frequency divider 420.

The PLL 440 is composed of a phase comparator 402, a loop filter 410, a voltage-controlled oscillator (VCO) 416 and a frequency divider 420. The phase comparator has a signal input 404, a feedback input 430, and an output. The loop filter 410, the VCO 416, and the frequency divider 420 are connected in series between the output and the feedback input 430 of the phase comparator 402.

The signal input 404 of the phase comparator 402 is connected to the reference signal source 408 to receive the reference signal 406 therefrom. The phase comparator 402 derives a comparison signal 412 by comparing the phase of the feedback signal 428 generated by the frequency divider 420 with that of the reference signal 406. The loop filter 410 is connected to the output of the phase comparator 402 to receive the comparison signal 412 therefrom.

The loop filter 410 filters the comparison signal 412 to generate a frequency control signal 414. An input of the voltage-controlled oscillator (VCO) 416 is connected to the output of the loop filter 410 to receive the frequency control signal 414 therefrom.

The VCO 416 generates the output signal 418 at a frequency defined by the frequency control signal 414. An input 424 of the frequency divider 420 is connected to the output of the VCO 416 to receive the output signal 418 therefrom. The frequency divider 420 divides the frequency of the output signal 418 to generate a feedback signal 428. The feedback input 430 of the phase comparator 402 is connected to the output 426 of the frequency divider 420 to receive the feedback signal 428 therefrom.

The output 426 of the frequency divider 420 is additionally connected to the lower-order modulator 110 and to the higher-order modulator 118 of the sigma-delta modulator 100 to provide the feedback signal 428 as the clock signal for the delay registers 208, 218, 224 and 226 (FIG. 2) thereof.

The frequency divider 420 additionally has a control input 432 connected to the output of the divide ratio sequence generator 450 to receive the temporally-varying divide ratio sequence 456 generated thereby.

The divide ratio sequence generator 450 has one input connected to receive the integer portion 454 of the divide ratio control signal 452 and has another input connected to the output 240 of the sigma-delta modulator 100 to receive the sigma-delta modulated signal 120 generated thereby. The divide ratio sequence generator 450 combines the integer portion 454 of the divide ratio control signal 452 with the sigma-delta modulated signal 120 that represents the fractional portion 120 of the divide ratio control signal to generate the temporally-varying divide ratio sequence 456 that controls the divide ratio of the frequency divider 420.

In operation, the signal input 404 of the phase comparator 402 receives the reference signal 406. The comparison signal 412 generated by the phase comparator 402 is connected to the input of the loop filter 410. The loop filter 410 is a lowpass filter that filters the comparison signal 412 to generate the frequency control signal 414. The loop filter 410 additionally stabilizes the PLL 440 and removes quantization noise and frequency spurs present in the output of the phase comparator 402.

The VCO 416 generates the output signal 418 at a frequency nominally (N+r) times the frequency of the reference signal 406. The output signal 418 generated by the VCO 416 is additionally input to the frequency divider 420. The divide ratio of the frequency divider 420 is variably set by the temporally-varying divide ratio sequence 456 generated by the divide ratio sequence generator 450 and the sigma-delta modulator 100 in response to the divide ratio control signal 452.

The frequency divider 420 divides the frequency of the output signal 418 by a nominal divide ratio of (N+r) in response to the temporally-varying divide ratio sequence 456 to generate the feedback signal 428. The feedback signal 428 is fed back to the feedback input 430 of the phase comparator 402 and is additionally used as the clock signal for the sigma-delta modulator 100.

The sigma-delta modulator 100 receives the fractional portion 102 of the divide ratio control signal 452 and generates therefrom the sigma-delta modulated signal 120. The digital divide ratio sequence generator 450 combines the sigma-delta modulated signal 120 with the integer portion 454 of the divide ratio control signal 452 to generate the temporally-varying divide ratio sequence 456. In an exemplary embodiment, the temporally-varying divide ratio signal changes the divide ratio of the frequency divider 420 among the values N−1, N, N+1 and N+2 in a manner that results in an average divide ratio of (N+r). However, the three-bit sigma-delta modulated signal 120 generated by the embodiment of the sigma-delta modulator 100 described above with reference to FIG. 2 provides the possibility of generating a temporally-varying divide ratio sequence that provides a greater number of values of the divide ratio than the four just described. The temporally-varying divide ratio sequence 456 provided by the divide ratio sequence generator 450 in response to the sigma-delta modulator 100 causes relatively large phase differences at the phase comparator 402 between the feedback signal 428 generated by the frequency divider 420 and the reference signal 406. These phase differences introduce quantization noise and frequency spurs into the output of the phase comparator 402. However, the temporally-varying divide ratio sequence 456 generated by the divide ratio sequence generator 450 in response to the sigma-delta modulator 100 shapes the quantization noise and frequency spurs of the divider output 426 away from the carrier. Consequently, the quantization noise and frequency spurs can be filtered by the loop filter 410.

In an embodiment of a PLL frequency synthesizer 400 in which the value of N is fixed, the divide ratio control signal 452 has no integer portion and the divide ratio sequence generator 450 is omitted. In such embodiment, the output 240 of the sigma-delta modulator 100 is connected directly to the control input 432 of the frequency divider 420 and the sigma-delta modulated signal 120 provides the temporally-varying divide ratio sequence 456 for the frequency divider 420.

Thus, it has been discovered that the method and apparatus of the present invention furnish important and heretofore unavailable solutions, capabilities, and functional advantages for digital modulation circuits, such as phase-locked loops and digital to analog converters. The resulting process and configurations are straightforward, economical, uncomplicated, highly versatile, and effective, use conventional technologies, and are thus readily suited for manufacturing devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

The invention claimed is:

1. A sigma-delta modulation method, comprising:
partitioning a digital input signal comprising (M+L)-bit words into a less-significant bit signal and a more-significant bit signal wherein the partitioning comprises partitioning the digital input signal into the more-significant bit signal comprising M-bit words and the partitioning comprises partitioning the digital input signal into the less-significant bit signal comprising L-bit words;
performing a lower-order modulation of the less-significant bit signal to generate an intermediate output signal, the intermediate output signal comprises P-bit words, where P is less than L;
appending the intermediate output signal to the more-significant bit signal as less significant bits to form an intermediate input signal; and
performing a higher-order modulation of the intermediate output signal using a (M+P)-bit third order delta-sigma modulator to generate a digital output signal, the higher-order modulation of an order higher than the lower-order modulation.

2. A sigma-delta modulation method, comprising:
partitioning a digital input signal into a less-significant bit signal and a more-significant bit signal;
performing a lower-order modulation of the less-significant bit signal to generate an intermediate output signal;
appending the intermediate output signal to the more-significant bit signal as less significant bits to form an intermediate input signal; and
performing a higher-order modulation of the intermediate input signal to generate a digital output signal, the higher-order modulation of an order higher than the lower-order modulation wherein performing the higher-order modulation comprises performing the higher-order modulation using a third order delta-sigma modulator.

3. A sigma-delta modulator for modulating a digital input signal comprising (M+L)-bit words partitioned into less-significant bits and more-significant bits, the sigma-delta modulator comprising:
a lower-order modulator operable to modulate the L less-significant bits of the digital input signal to generate an intermediate output, the intermediate output comprises P-bit words, where P is less than L; and
a higher-order modulator of an order higher than the lower-order modulator operable to modulate the M more-significant bits of the digital input signal with the intermediate output appended thereto as less significant bits to generate a digital output signal, the higher-order modulator comprises a (M+P)-bit third-order sigma-delta modulator.

4. A sigma-delta modulator for modulating a digital input signal partitioned into less-significant bits and more-significant bits, the sigma-delta modulator comprising:
a lower-order modulator operable to modulate the less-significant bits of the digital input signal to generate an intermediate output; and
a higher-order modulator of an order higher than the lower-order modulator operable to modulate the more-significant bits of the digital input signal with the intermediate output appended thereto as less significant bits to generate a digital output signal wherein the higher-order modulator comprises a third-order sigma-delta modulator.

5. A Fractional_N phase-locked loop, comprising:
a phase comparator having a signal input, a feedback input, and an output, the signal input connected to receive a reference signal;
a voltage-controlled oscillator connected to the output of the phase comparator;
a divider connected between an output of the voltage controlled oscillator and the feedback input to the phase comparator, the divider having a variable divide ratio determined by a temporally-varying divide ratio sequence; and
a sigma-delta modulator for modulating a divide ratio control signal partitioned into less-significant bits and more-significant bits, comprising:
a lower-order modulator operable to modulate the less-significant bits of the divide ratio control signal to generate an intermediate output signal; and
a higher-order modulator of an order higher than the lower-order modulator, the higher-order modulator operable to modulate the more-significant bits of the divide ratio control signal with the intermediate output signal appended thereto as less significant bits to generate a sigma-delta modulated signal, the sigma-delta modulated signal constituting at least part of the temporally-varying divide ratio sequence.

6. The phase-locked loop as claimed in claim 5, wherein the phase-locked loop further comprises:
a filter connected between the output of the phase comparator and an input of the voltage controlled oscillator for filtering substantially all quantization noise and frequency spurs generated by the divider in response to the temporally-varying divide ratio sequence.

7. The phase-locked loop as claimed in claim 5, wherein the higher order modulator comprises a third-order sigma-delta modulator.

8. The phase-locked loop as claimed in claim 5, wherein the lower-order modulator has an absence of multipliers.

9. The phase-locked loop as claimed in claim 5, wherein the intermediate output signal has an average equal to a value of the less-significant bits.

10. The phase-locked loop as claimed in claim 5, wherein:
   the divide ratio control signal comprises an integer portion and a fractional portion;
   the lower-order modulator is operable to modulate the less-significant bits in the fractional portion of the divide ratio control signal;
   the higher-order modulator is operable to modulate the more-significant bits in the fractional portion of the divide ratio control signal with the intermediate output signal appended thereto as less significant bits; and
   the phase-locked loop additionally comprises a divide ratio sequence generator operable to generate the temporally-varying divide ratio sequence from the integer portion of the divide ratio control signal and the sigma-delta modulated signal.

11. The phase-locked loop as claimed in claim 10 wherein:
   the fractional portion of the divide ratio control signal comprises thirty-bit words each having 21 less-significant bits and 9 more-significant bits.

* * * * *